United States Patent [19]
Watanabe et al.

[11] Patent Number: 5,496,903
[45] Date of Patent: Mar. 5, 1996

[54] NEAR INFRARED POLYMERIZABLE COMPOSITION

[75] Inventors: Emi Watanabe, Osaka; Masami Kawabata, Katano; Iwao Sumiyoshi, Osaka, all of Japan

[73] Assignee: Nippon Paint Company, Ltd., Osaka, Japan

[21] Appl. No.: 428,818

[22] Filed: Apr. 25, 1995

[30] Foreign Application Priority Data

Apr. 25, 1994 [JP] Japan .................................. 6-086378

[51] Int. Cl.$^6$ .................................. C08F 2/46; C08F 4/52
[52] U.S. Cl. .................................. 526/204; 526/196
[58] Field of Search .................................. 526/204, 196

[56] References Cited

U.S. PATENT DOCUMENTS 4,391,687  7/1983  Vesley .................................. 526/204

Primary Examiner—Joseph L. Schofer
Assistant Examiner—Wu C. Cheng
Attorney, Agent, or Firm—Wenderoth, Lind & Ponack

[57] ABSTRACT

The present invention provides the near infrared polymerizable composition which has high sensitivity sufficient to provide excellent curability to the coating composition containing the same, even if the coating composition contains the pigment as well. The present invention provides a near infrared polymerizable composition comprising a cyanine dye, a S-triazine compound, an organoboron salt and an ethylenically unsaturated compound.

16 Claims, No Drawings

NEAR INFRARED POLYMERIZABLE COMPOSITION

FIELD OF THE INVENTION

The present invention relates to a photopolymerizable composition. More specifically, the present invention relates to a near infrared polymerizable composition.

PRIOR ART

The photopolymerizable composition may easily cure without diffusing injurious materials such as organic solvent by a simple procedure, and it has hitherto been developed in the field where a curable polymeric material is required. For example, an ultraviolet polymerizable composition comprising an ultraviolet polymerization initiator have widely been used for coatings, photoresists, printing materials and the like.

However, the ultraviolet polymerizable composition requires a large and expensive apparatus for irradiation, such as ultra-high pressure mercury lamp, which accompanies danger and high cost. Further, ultraviolet light has poor transmittance, so that the bottom of a coated layer may not cure sufficiently, particularly when it contains a pigment.

On the contrary, near infrared light can be irradiated by means of a small, cheap and safe generator, and it has excellent transmittance. Accordingly, it is desired a photopolymerization initiator which is sensitive to near infrared light.

For example, Japanese Laid-Open Patent Publication No. H2-4804 discloses a near infrared sensitizing system comprising a combination of a cationic dye and a boron salt. However, sensitivity of this system is low, and the system can not be used for a coating composition, particularly when it contains the pigment.

SUMMARY OF THE INVENTION

The present invention provides the near infrared polymerizable composition which has high sensitivity sufficient to provide excellent curability to the coating composition containing the same, even if the coating composition contains the pigment as well.

The present invention provides a near infrared polymerizable composition comprising a cyanine dye, a S-triazine compound, an organoboron salt and an ethylenically unsaturated compound.

DETAILED DESCRIPTION OF THE INVENTION

The wording "near infrared light" used in the present specification means light having a wavelength of 680 to 1000 nm. The wording "near infrared polymerizable composition" or "near infrared polymerizable coating composition" used in the present specification means a resin composition or a coating composition which is able to cure when it is irradiated with the near infrared light.

The cyanine dye employed in the present invention may be any sensitizing dye having an absorption maximum within an range of 600 to 1100 nm, which is known to those skilled in the art. Preferably, it is the sensitizing dye having a chemical structure of the formula:

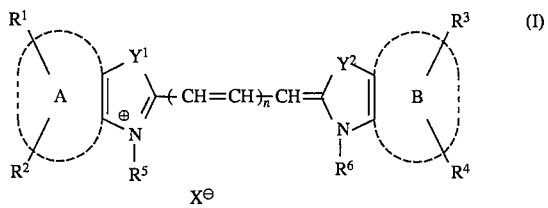

wherein ring A and ring B each independently represent a benzene ring or a naphthalene ring; n is an integer of 2 to 5; $X^-$ is $Cl^-$, $Br^-$, $I^-$, $ClO_4^-$, $OH^-$, a carboxylate anion, a hydrogensulfate anion or an organoboron anion; $Y^1$ and $Y^2$ each independently represent a sulfur atom, an oxygen atom, an ethylene group, a dimethylmethylene group or a selenium atom; $R^1$ to $R^4$ each independently represent a hydrogen atom, a chlorine atom, an alkyl group having 1 to 10, preferably 1 to 4 carbon atoms, a haloalkyl group having 1 to 10, preferably 1 to 4 carbon atoms, an ethylenyl group, a styryl group, an alkoxy group having 1 to 10, preferably 1 to 4 carbon atoms, a phenyl group, a naphthyl group, an alkylphenyl group having 7 to 16. preferably 7 to 10 carbon atoms, a hydroxyphenyl group, a halophenyl group, a nitrophenyl group, an aminophenyl group, a nitro group, an amino group or a hydroxyl group; and $R^5$ and $R^6$ each independently represent an alkyl group having 1 to 10, preferably 1 to 4 carbon atoms.

Particularly preferred examples of the cyanine dye include 3,3'-diethyl-2,2'-thiadicarbocyanine iodide, 3,3'-diethyl-2,2'-thiatricarbocyanine iodide, 3,3'-diethyl-2,2'-thiatricarbocyanine bromide, 3,3'-diethyl-6,6'-dimethoxy-2,2'-thiatricarbocyanine iodide, 3,3'-diethyl-5,5',6,6'-tetramethyl-2,2'-thiatricarbocyanine iodide, 3,3'-diethyl-2, 2'-oxatricarbocyanine iodide, 3,3'-diethyl-2,2'-thiadicarbocyanine bromide, 3,3'-diethyl-2,2'-thiatetracarbocyanine iodide, 3,3'-diethyl-2,2'-thiapentacarbocyanine iodide, 3,3'-dibutyl-2,2'-thiatricarbocyanine iodide, 3,3'-diethyl-2,2'-(4,5,4',5'-dibenzo)thiadicarbocyanine iodide, 3,3'-diethyl-2,2'-(4,5,4',5'-dibenzo)thiatricarbocyanine iodide, 3,3'-diethyl- 2,2'-oxadicarbocyanine iodide, 3,3'-diethyl-2,2'-oxatricarbocyanine iodide, 1,3,3,1',3',3'-hexamethylindotricarbocyanine iodide, 1,3,3,1',3',3'-hexamethylindotricarbocyanine perchlorate, 1,3,3,1',3',3'-hexamethyl-2,2'-(4,5,4',5'-dibenzo)indotricarbocyanineindohe xacarbocyanine iodide and the like.

The cyanine dye is included in the near infrared polymerizable composition of the present invention in an amount of 0.005 to 5 parts by weight, preferably 0.01 to 1 parts by weight, based on 100 parts by weight of the ethylenically unsaturated compound. When an amount of the cyanine dye is smaller than 0.005 parts by weight, curability of the composition becomes insufficient. On the other hand, when the amount exceeds 5 parts by weight, the bottom of the coated layer may not cure sufficiently.

The S-triazine compound employed in the present invention preferably has at least one methyl group having at least one chlorine atom or a bromine atom which substitutes hydrogen atom thereof.

Particularly preferred is the S-triazine compound having at least one trichloromethyl group which bonds to a carbon atom of the framework of the S-triazine, having a chemical structure of the formula:

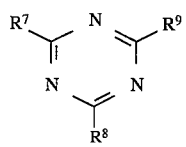

wherein $R^7$, $R^8$ and $R^9$ each independently represent a trichloromethyl group, an optionally-substituted alkyl group having 1 to 10, preferably 1 to 4 carbon atoms, an aryl group having 6 to 15, preferably 6 to 10 carbon atoms, an aralkyl group having 7 to 25, preferably 7 to 14 carbon atoms, an alkoxy group having 1 to 10, preferably 1 to 4 carbon atoms, an alkenyl group having 2 to 15, preferably 2 to 10 carbon atoms, a piperidino group, a piperonyl group, an amino group, a dialkylamino group having 2 to 20, preferably 2 to 8 carbon atoms, a thiol group or an alkylthio group having 1 to 10, preferably 1 to 4 carbon atoms; with the proviso that at least one of $R^7$ to $R^9$ represents the trichloromethyl group.

Particularly preferred examples of the S-triazine include 2,4,6-tris(trichloromethyl)-S-triazine, 2-methyl-4,6-bis-(trichloromethyl)-S-triazine, 2-methoxy-4,6-bis(trichloromethyl)-S-triazine, 2-phenyl-4,6-bis(trichloromethyl)-S-triazine, 2-(p-methoxyphenyl)-4,6-bis(trichloromethyl)-S-triazine, 2-(4-methylthiophenyl)-4,6-bis(trichloromethyl)-S-triazine, 2-(p-chlorophenyl)-4,6-bis(trichloromethyl)-S-triazine, 2-(4-methoxynaphthyl)-4,6-bis(trichloromethyl)-S-triazine, 2-piperonyl-4,6-bis(trichloromethyl)-S-triazine, 2-piperidino-4,6-bis(trichloromethyl)-S-triazine, 2-styryl-4,6-bis(trichloromethyl)-S-triazine, 2-(p-methoxystyryl)-4,6-bis(trichloromethyl)-S-triazine, 2-(3,4-dimethoxystyryl)-4,6-bis(trichloromethyl)-S-triazine, 2-(p-dimethylaminostyryl)-4,6-bis(trichloromethyl)-S-triazine and the like. Among them, 2,4,6-tris(trichloromethyl)-S-triazine is particularly preferred in view of photosensitivity.

The S-triazine compound is included in the near infrared polymerizable composition of the present invention in an amount of 0.1 to 20 parts by weight, preferably 0.5 to 5 parts by weight, based on 100 parts by weight of the ethylenically unsaturated compound. When an amount of the S-triazine compound is smaller than 0.1 parts by weight, curability of the composition becomes insufficient. On the other hand, when the amount exceeds 20 parts by weight, solvent resistance of the cured material becomes poor.

The organoboron salt employed in the present invention is a salt which consists of a quaternary ammonium cation and an organoboron anion, having a chemical structure of the formula:

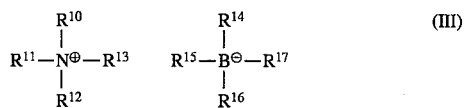

wherein $R^{10}$, $R^{11}$, $R^{12}$ and $R^{13}$ each independently represent a hydrogen atom, an alkyl group having 1 to 10, preferably 1 to 4 carbon atoms, an aryl group having 6 to 15, preferably 6 to 10 carbon atoms, an alkaryl group having 2 to 10, preferably 2 to 5 carbon atoms, an allyl group, an aralkyl group having 1 to 10, preferably 1 to 4 carbon atoms, an alkenyl group having 1 to 10, preferably 1 to 4 carbon atoms, an alkynyl group having 1 to 10, preferably 1 to 4 carbon atoms or a silyl group; and $R^{14}$, $R^{15}$, $R^{16}$ and $R^{17}$ each independently represent an alkyl group having 1 to 10, preferably 1 to 4 carbon atoms, an aryl group having 6 to 15, preferably 6 to 10 carbon atoms, an alkaryl group having 2 to 10, preferably 2 to 5 carbon atoms, an allyl group, an aralkyl group having 1 to 10, preferably 1 to 4 carbon atoms, an alkenyl group having 1 to 10, preferably 1 to 4 carbon atoms or an alkynyl group having 1 to 10, preferably 1 to 4 carbon atoms; with the proviso that at least one of $R^{14}$ to $R^{17}$ represents the alkyl group.

Particularly preferred examples of the organoboron salt include tetramethylammonium triphenyl n-butyl borate, tetramethylammonium triphenyl n-octyl borate, tetraethylammonium triphenyl n-butyl borate, tetra-n-butylammonium triphenyl n-butyl borate, tetramethylammonium trianisyl n-butyl borate, tetramethylammonium tetraphenyl borate and tetraethylammonium diphenyl di-n-butyl borate.

The organoboron salt is included in the near infrared polymerizable composition of the present invention in an amount of 0.1 to 20 parts by weight, preferably 0.5 to 5 parts by weight, based on 100 parts by weight of the ethylenically unsaturated compound. When an amount of the organoboron salt is smaller than 0.1 parts by weight, curability of the composition becomes insufficient. On the other hand, when the amount exceeds 20 parts by weight, solvent resistance of the cured material becomes poor.

The ethylenically unsaturated compound employed in the present invention may be any compound which has an ethylenically unsaturated double bond, and which radically addition-polymerizes to cure by an action of the photopolymerization initiator.

Examples thereof include unsaturated carboxylic acids such as acrylic acid, methacrylic acid, itaconic acid and maleic acid; esters of polyhydroxy compounds (e.g., ethylene glycol, tetraethylene glycol, neopentyl glycol, propylene glycol, 1,2-butanediol, trimethylolpropane, pentaerythritol and dipentaerythritol) with the above unsaturated carboxylic acids; addition reactants of epoxides (e.g., trimethylolpropane polyglycidyl ether, pentaerythritol polyglycidyl ether, propylene glycol diglycidyl ether, a reactant of epichlorohydrin with 2,2-bis(4-hydroxyphenyl)-propane, and diglycidyl ester of phthalic acid) with the above unsaturated carboxylic acids; and acrylamides and methacrylamides such as acrylamide, ethylene-bis-acrylamide, ethylene-bis-methacrylamide, hexamethylene-bis-acrylamide and hexamethylene-bis-methacrylamide. Among them, acrylates and methacrylates are preferred in view of curing properties.

Further, polyurethane(meth)acrylates obtained by reacting polyester polyol (e.g., those obtained by reacting diol components such as ethylene glycol, diethylene glycol and 1,3-butylene glycol, with acid components such as dibasic acids such as phthalic acid, tetrahydrophthalic acid, hexahydrophthalic acid or anhydrides thereof), polyisocyanate (e.g., tolylene diisocyanate, 4,4'-diphenylmethane diisocyanate, isophorone diisocyanate and hexamethylene diisocyanate) and hydroxyl group-containing (meth)acrylate (e.g., 2-hydroxyethyl (meth)acrylate and 2-hydropropyl (meth)acrylate); bisphenollic epoxy acrylates obtained by reacting a bisphenollic epoxy resin (e.g., Epicoat 828, Epicoat 1001, Epicoat 1004 and Epicoat 807 manufactured by Yuka Shell Kagaku Co., Ltd.) with (meth)acrylic acid; and novolac epoxyacrylates obtained by reacting a novolac epoxy resin (e.g. Epicoat 152 and Epicoat 154 manufactured by Yuka Shell Kagaku Co., Ltd.) with (meth)acrylic acid can also suitably be used.

The near infrared polymerizable composition of the present invention can be prepared by combining the above cyanine dye, S-triazine compound, organoboron salt and ethylenically unsaturated compound, using an apparatus known to those skilled in the art such as high-speed stirrer.

The resulting near infrared polymerizable composition has a sensitivity to light of from ultraviolet to near infrared, and it can be cured by using a light source such as a mercury lamp, a metal halide lamp, a tungsten lamp, a xenon lamp, a halogen lamp, a semi-conductor laser, a argon laser, a helium-neon laser, a krypton laser, a YAG laser and the like.

The near infrared polymerizable composition of the present invention is colored by the cyanine dye before curing. However, the color of the cyanine dye disappears when the composition is irradiated, and the composition becomes colorless after curing. The above described characteristic is particularly useful when the composition is used in combination with the coloring materials described below.

By employing optionally conventional additives such as solvents, pigments, dyes, polymer binders, thermal polymerization inhibitors, antioxidants, ultraviolet absorbers, photostabilizers and plasticizers, the near infrared polymerizable composition of the present invention can be formulated to a photocurable material such as a photocurable coating composition, a laser printing material, a hologram recording material, a resin for 3D-photolithography, a resist material and the like. Particularly, the near infrared polymerizable composition of the present invention has high sensitivity, and therefore, it cures uniformly throughout the coated layer, even when the layer includes a light-interuptive additive such as the pigment.

Accordingly, the infrared polymerizable coating composition containing the near infrared polymerizable composition of the present invention and the pigment is useful. The pigment employed in combination with the near infrared polymerizable composition of the present invention is not particularly limited in view of its characteristics or properties, and may be any pigment employed for preparing a conventional coating composition or an ink composition.

The pigment is included in the near infrared polymerizable composition of the present invention in an amount of 0.1 to 200 parts by weight, preferably 1 to 40 parts by weight, based on 100 parts by weight of the ethylenically unsaturated compound. When an amount of the pigment exceeds 200 parts by weight, the bottom of the coated layer may not cure sufficiently. On the other hand, when the amount is smaller than 0.1 parts by weight, opacifying power becomes poor.

The near infrared polymerizable coating composition of the present invention can be prepared by combining the near infrared polymerizable composition of the present invention with the additives above described. The method for combining is not specifically limited and any method known to those skilled in the art may be employed.

EXAMPLES

The following Examples and Comparative Examples further illustrate the present invention in detail but are not to be construed to limit the scope thereof. In the Examples and Comparative Examples, all "parts" are based on weight unless otherwise stated.

Examples 1 to 4 and Comparative Examples 1 to 4

These examples describes sensitivity of various photopolymerizable compositions comprising the cyanine dye shown below as dyes 1 to 4; the S-triazine compound shown below as TCMT and TAZ; the organoboron salt shown below as AB; and the ethylenically unsaturated compound which is pentaerythritol triacrylate (PETA).

Dye 1: 3,3'-Diethyl-2,2'-thiatricarbocyanine iodide

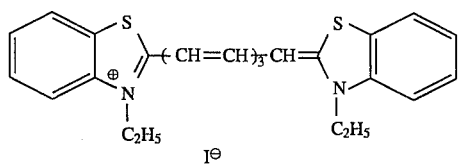

Dye 2: 3,3'-Diethyl-6,6',2,2'-thiatricarbocyanine perchlorate

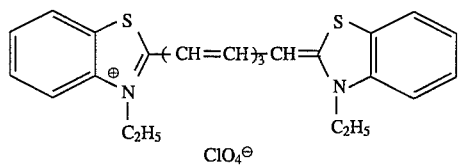

Dye 3: 1,3,3,1',3', 3'-Hexamethylindotricarbocyanine iodide

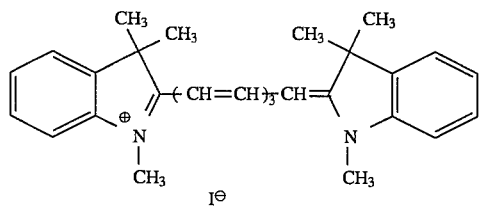

Dye 4: 3,3'-Diethyl-2,2'-thiacyanine iodide

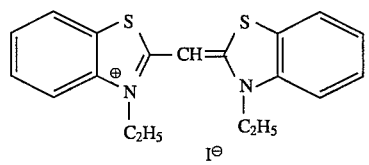

TCMT: 2,4,6-Tris(trichloromethyl)-S-triazine

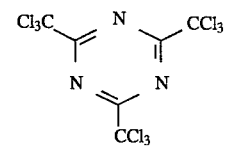

TAZ: 2-(P-methoxystyryl)-4,6-bis(trichloromethyl)-S-triazine

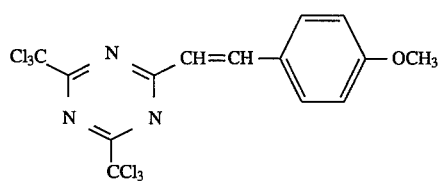

AB: Tetramethylammonium triphenyl n-butyl borate

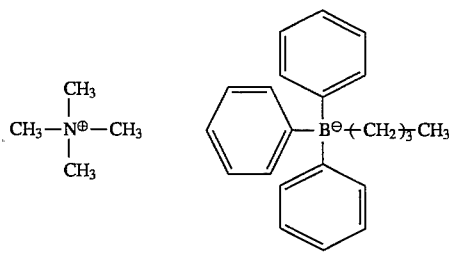

A photopolymerizable composition was prepared according to the components shown in Table 1. The composition was dissolved in dichloroethane and a predetermined amount of the resulting solution was charged in an aluminum pan for DSC. Dichloroethane was distilled off by heating to give 10 mg of the photopolymerizable composition in the aluminum pan. Then, the photopolymerizable composition in the aluminum pan was irradiated by light having a wavelength of not less than 680 nm and an intensity at 800 nm of 0.4 mW/cm² from a xenon lamp fitted with a differential scanning calorimeter (Model DSC220, manufactured by Seiko Denshi Kogyo Co., Ltd.). The calorific value of the photopolymerizable composition during irradiation was measured by the differential scanning calorimeter. The results are shown in Table 1. The large calorific value of the photopolymerizable composition during irradiation of Table 1 indicates high sensitivity to irradiation.

TABLE 1

| | Cyanine dye | Triazine compound | Organoboron salt | Ethylenically unsaturated compound | Calorific value (mJ/mg) |
|---|---|---|---|---|---|
| Example 1 | Dye 1 1 part | TCMT 4 parts | AB 3 parts | PETA 100 parts | 299 |
| Example 2 | Dye 2 1 part | TCMT 4 parts | AB 3 parts | PETA 100 parts | 280 |
| Example 3 | Dye 3 1 part | TCMT 4 parts | AB 3 parts | PETA 100 parts | 293 |
| Example 4 | Dye 1 1 part | TAZ 4 parts | AB 3 parts | PETA 100 parts | 191 |
| Comp. Ex. 1 | Dye 1 1 part | TCMT 4 parts | — | PETA 100 parts | 99 |
| Comp. Ex. 2 | Dye 1 1 part | — | AB 3 parts | PETA 100 parts | 0 |
| Comp. Ex. 3 | Dye 2 1 part | — | AB 3 parts | PETA 100 parts | 0 |
| Comp. Ex. 4 | Dye 4 1 part | TCMT 1 part | — | PETA 100 parts | 0 |

Example 5

The near infrared polymerizable coating composition was prepared according to the components shown in Table 2. The resulting coating composition was applied on a white plate to a layer having a thickness of 30 μm. The coated layer was then irradiated at a distance of 10 cm for 1.5 minute using a 200 W halogen lamp. The coated layer thus formed cured uniformly to the bottom, and the color of dye 1 disappeared and had no influence in the color of the pigment.

TABLE 2

| Components | Trade name | Amount (parts) |
|---|---|---|
| Yellow pigment | "TAROX LL-XLO", manufactured by Chitan Kogyo Co., Ltd. | 12 |
| Monomers | Urethane acrylate "UVR-2003", manufactured by Nippon Paint Co., Ltd. | 40 |
| | "NK-ESTER ADP-6", manufactured by Shin-nakamura Kagaku Kogyo Co., Ltd. | 40 |
| | "RNK-0248", manufactured by Kyoei-sha Yushi Kagaku Kogyo Co.,, Ltd. | 20 |
| Surface adjustor | "MEGAFAK F-177", manufactured by Dainippon Ink Chemical Industries Co., Ltd. | 0.3 |
| Near infrared sensitizing system | Dye 1 | 0.35 |
| | TCMT | 1.40 |
| | AB | 1.05 |

What is claimed is:

1. A near infrared polymerizable composition comprising a cyanine dye, a S-triazine compound, an organoboron salt and an ethylenically unsaturated compound.

2. The near infrared polymerizable composition according to claim 1, wherein the cyanine dye has a chemical structure of the formula:

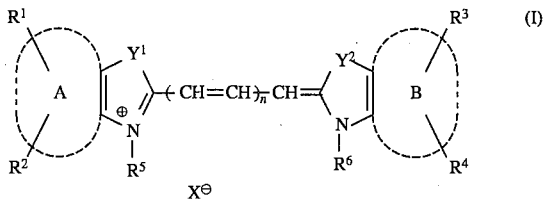

wherein ring A and ring B each independently represent a benzene ring or a naphthalene ring; n is an integer of 2 to 5; $X^-$ is $Cl^-$, $Br^-$, $I^-$, $ClO_4^-$, $OH^-$, a carboxylate anion, a hydrogensulfate anion or an organoboron anion; $Y^1$ and $Y^2$ each independently represent a sulfur atom, an oxygen atom, an ethylene group, a dimethylmethylene group or a selenium atom; $R^1$ to $R^4$ each independently represent a hydrogen atom, a chlorine atom, an alkyl group having 1 to 10 carbon atoms, a haloalkyl group having 1 to 10 carbon atoms, an ethylenyl group, a styryl group, an alkoxy group having 1 to 10 carbon atoms, a phenyl group, a naphthyl group, an alkylphenyl group having 7 to 16 carbon atoms, a hydroxyphenyl group, a halophenyl group, a nitrophenyl group, an aminophenyl group, a nitro group, an amino group or a hydroxyl group; and $R^5$ and $R^6$ each independently represent an alkyl group having 1 to 10 carbon atoms.

3. The near infrared polymerizable composition according to claim 1, wherein the cyanine dye is selected from the group consisting of 3,3'-diethyl-2,2'-thiadicarbocyanine iodide, 3,3'-diethyl-2,2'-thiatricarbocyanine iodide, 3,3'-diethyl-2,2'-thiatricarbocyanine bromide, 3,3'-diethyl-6,6'-dimethoxy-2,2'-thiatricarbocyanine iodide, 3,3'-diethyl-5,5', 6,6'-tetramethyl-2,2'-thiatricarbocyanine iodide, 3,3'-diethyl-2,2'-oxatricarbocyanine iodide, 3,3'-diethyl-2,2'-thiadicarbocyanine bromide, 3,3'-diethyl-2,2'-thiatetracarbocyanine iodide, 3,3'-diethyl-2,2'-thiapentacarbocyanine iodide, 3,3'-dibutyl-2,2'-thiatricarbocyanine iodide, 3,3'-diethyl-2,2'-(4,5,4',5'-dibenzo)thiadicarbocyanine iodide, 3,3'-diethyl-2,2'-(4,5,4',5'-dibenzo)thiatricarbocyanine iodide, 3,3'-diethyl-2,2'-oxadicarbocyanine iodide, 3,3'-diethyl-2,2'-oxatricarbocyanine iodide, 1,3,3,1',3',3'-hexamethylindotricarbocyanine iodide, 1,3,3,1',3',3'-hexamethylindotricarbocyanine perchlorate, 1,3,3,1',3',3'-hexamethyl-2,2'-(4,5,4',5'-dibenzo)indotricarbocyanineindohe xacarbocyanine iodide.

4. The near infrared polymerizable composition according to claim 1, wherein the S-triazine has a chemical structure of the formula:

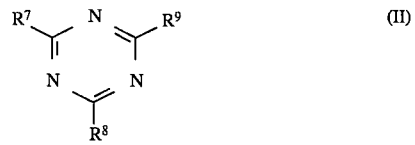

wherein $R^7$, $R^8$ and $R^9$ each independently represent a trichloromethyl group, an optionally substituted alkyl group having 1 to 10 carbon atoms, an aryl group having 6 to 15 carbon atoms, an aralkyl group having 7 to 25 carbon atoms, an alkoxy group having 1 to 10 carbon atoms, an alkenyl group having 2 to 15 carbon atoms, a piperidino group, a piperonyl group, an amino group, a dialkylamino group having 2 to 20 carbon atoms, a thiol group or an alkylthio group having 1 to 10 carbon atoms; with the proviso that at least one of $R^7$ to $R^9$ represents the trichloromethyl group.

5. The near infrared polymerizable composition according to claim 1, wherein the S-triazine is selected from the group consisting of 2,4,6-tris(trichloromethyl)-S-triazine, 2-methyl-4,6-bis(trichloromethyl)-S-triazine, 2-methoxy-4,6-bis-(trichloromethyl)-S-triazine, 2-phenyl-4,6-bis(trichloromethyl)-S-triazine, 2-(p-methoxyphenyl)-4,6-bis(trichloromethyl)-S-triazine, 2-(4-methylthiophenyl)-4,6-bis(trichloromethyl)-S-triazine, 2-(p-chlorophenyl)-4,6-bis(trichloromethyl)-S-triazine, 2-(4-methoxynaphthyl)-4,6-bis(trichloromethyl)-S-triazine, 2-piperonyl-4,6-bis(trichloromethyl)-S-triazine, 2-piperidino-4,6-bis(trichloromethyl)-S-triazine, 2-styryl-4,6-bis(trichloromethyl)-S-triazine, 2-(p-methoxystyryl)-4,6-bis(trichloromethyl)-S-triazine, 2-(3,4-dimethoxystyryl)-4,6-bis(trichloromethyl)-S-triazine, 2-(p-dimethylaminostyryl)-4,6-bis(trichloromethyl)-S-triazine.

6. The near infrared polymerizable composition according to claim 1, wherein the S-triazine is 2,4,6-tris(trichloromethyl)-S-triazine.

7. The near infrared polymerizable composition according to claim 1, wherein the organoboron salt has a chemical structure of the formula:

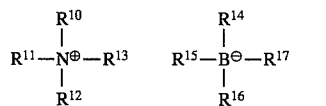 (III)

wherein $R^{10}$, $R^{11}$, $R^{12}$ and $R^{13}$ each independently represent a hydrogen atom, an alkyl group having 1 to 10 carbon atoms, an aryl group having 6 to 15 carbon atoms, an alkaryl group having 2 to 10 carbon atoms, an allyl group, an aralkyl group having 1 to 10 carbon atoms, an alkenyl group having 1 to 10 carbon atoms, an alkynyl group having 1 to 10 carbon atoms or a silyl group; and $R^{14}$, $R^{15}$, $R^{16}$ and $R^{17}$ each independently represent an alkyl group having 1 to 10 carbon atoms, an aryl group having 6 to 15 carbon atoms, an alkaryl group having 2 to 10 carbon atoms, an allyl group, an aralkyl group having 1 to 10 carbon atoms, an alkenyl group having 1 to 10 carbon atoms or an alkynyl group having 1 to 10 carbon atoms; with the proviso that at least one of $R^{14}$ to $R^{17}$ represents the alkyl group.

8. The near infrared polymerizable composition according to claim 1, wherein the organoboron salt is selected from the group consisting of tetramethylammonium triphenyl n-butyl borate, tetramethylammonium triphenyl n-octyl borate, tetraethylammonium triphenyl n-butyl borate, tetra-n-butylammonium triphenyl n-butyl borate, tetramethylammonium trianisyl n-butyl borate, tetramethylammonium tetraphenyl borate and tetraethylammonium diphenyl di-n-butyl borate.

9. A near infrared polymerizable coating composition containing the near infrared polymerizable composition according to claim 1, and a pigment.

10. A near infrared polymerizable coating composition containing the near infrared polymerizable composition according to claim 2, and a pigment.

11. A near infrared polymerizable coating composition containing the near infrared polymerizable composition according to claim 3, and a pigment.

12. A near infrared polymerizable coating composition containing the near infrared polymerizable composition according to claim 4, and a pigment.

13. A near infrared polymerizable coating composition containing the near infrared polymerizable composition according to claim 5, and a pigment.

14. A near infrared polymerizable coating composition containing the near infrared polymerizable composition according to claim 6, and a pigment.

15. A near infrared polymerizable coating composition containing the near infrared polymerizable composition according to claim 7, and a pigment.

16. A near infrared polymerizable coating composition containing the near infrared polymerizable composition according to claim 8, and a pigment.

* * * * *